United States Patent [19]

Ikeda et al.

[11] Patent Number: 5,235,174

[45] Date of Patent: Aug. 10, 1993

[54] IMAGE SENSOR HAVING DUAL SHIFT REGISTERS AND A PLURALITY OF CAPACITORS

[75] Inventors: Chikaho Ikeda; Hiroshi Fujimagari, both of Kanagawa, Japan

[73] Assignee: Fuji Xerox Co., Ltd., Tokyo, Japan

[21] Appl. No.: 751,769

[22] Filed: Aug. 29, 1991

[30] Foreign Application Priority Data

Aug. 30, 1990 [JP] Japan .................................. 2-226514

[51] Int. Cl.$^5$ .................................................. H01J 40/14
[52] U.S. Cl. .................................. 250/208.1; 358/213.18
[58] Field of Search ............... 250/208.1, 208.3, 578, 250/211 J, 24 R, 226; 358/213.11, 213.15, 213.18, 213.28, 213.16, 213.31, 213.26, 212

[56] References Cited

U.S. PATENT DOCUMENTS

| | | | |
|---|---|---|---|
| 4,556,800 | 12/1985 | Ohta et al. | 358/213.29 |
| 4,565,928 | 1/1986 | Yamamoto et al. | 250/208.3 |
| 5,023,443 | 6/1991 | Komatsu et al. | 250/208.1 |

FOREIGN PATENT DOCUMENTS 58-56363 4/1983 Japan .

OTHER PUBLICATIONS

Ozawa, Kiyoshi et al., "Contact-Type Linear Sensor Using Amorphous Si Diode-Array", Japanese Journal of Applied Physics, vol. 22 (1983) Supplement 22-1, pp. 457-460.

Yamamoto, H. et al., "High Speed Contact Type Linear Sensor Array Using a-Si pin Diodes", 15th Conference on Solid State Devices and Material, Tokyo 1983 pp. 205-208.

Swartz, L. et al., "A High Speed High Resolution Contact Line Imager Using Amorphous Silicon Alloy Pin Diodes", MRS Proc. vol. 95 1987 1987 pp. 633-638.

Primary Examiner—David C. Nelms
Assistant Examiner—Que T. Le
Attorney, Agent, or Firm—Finnegan, Henderson, Farabow, Garrett & Dunner

[57] ABSTRACT

An image sensor having a linear array of a plurality of photodetecting element groups each including a plurality of photodetecting elements each consisting of first and second photo diodes connected in series and oppositely in polarity, in which read pulses are applied sequentially to the second photo diodes of the photodetecting elements of each photodetecting element group by a matrix drive system, and image signals are read by a read circuit connected to the first photo diodes of the photodetecting elements. In the image sensor, first capacitor portions are connected to the second photo diodes of the photodetecting elements. A first shift register is connected to the first capacitor portions for each photodetecting element group. The first shift register sequentially applies drive pulses to the photodetecting element groups. Second capacitor portions are connected to the second photo diodes of the photodetecting elements. A second shift register is connected to the second capacitor portions in a matrix fashion. The second shift register sequentially applies read pulses to the respective photodetecting elements. A leak unit is coupled with the second photo diodes of the photodetecting elements.

9 Claims, 6 Drawing Sheets

IMAGE SENSOR HAVING DUAL SHIFT REGISTERS AND A PLURALITY OF CAPACITORS

BACKGROUND OF THE INVENTION

1. Field of the Invention

The present invention relates to an image sensor used in an input section of a facsimile or the like, and more particularly to an improvement of an image sensor having a linear array of a plurality of photodetecting elements each consisting of a photo diode and a blocking diode connected in series and oppositely in polarity.

2. Discussion of the Related Art

Conventionally, an image sensor for reading an image in a facsimile or the like has a linear array 2 of a plurality of photodetecting elements 1 each consisting of a photo diode PD and a blocking diode BD connected in series and oppositely in polarity, as shown in FIG. 6. In the image sensor shown in FIG. 6, the photodetecting element array 2 is segmented into a plurality of groups $3_1$–$3_n$ each consisting of a number of photodetecting elements 1. In reading image information from the photodetecting elements 1, a single shift register SR is matrix-driven to sequentially select the photodetecting element groups $3_1$–$3_n$ and to couple the selected one to a read circuit 4 (see Japanese Patent Unexamined Publication No. Sho. 58-56363).

The image read operation by the image sensor thus constructed will be described.

One of block select switches $7_1$–$7_n$ selects one of the photodetecting element groups $3_1$–$3_n$, and connects the selected one to a common wire 5. Under this condition, the shift register SR scans the photodetecting elements 1 constituting the selected group, that is, sequentially applies signals to the elements, to charge the reversely biased photo diodes PD. At this time, the blocking diode BD in other groups are reversely biased by power sources 6 that are selected by the block select switches, in order to prevent crosstalk occurrence within the photodetecting element groups.

The above sequence of operations is performed for each photodetecting element group by switching the block select switches $7_1$–$7_n$. In this way, the photo diodes PD of all the photodetecting elements 1 constituting the photodetecting element array 2, are charged.

During one cycle of the scan, the photo diodes PD are illuminated with light, and emit the charge according to the amounts of light.

The shift register SR sequentially applies read pulses to the photodetecting elements 1 again, to supply charge to the photo diodes PD according to the amounts of discharge. The currents caused by the recharge are read by the read circuit 4. In this way, the image signals are time-sequentially picked up.

In the image sensor thus constructed and operated, group wires $8_n$ in groups $3_n$ other than the group to be read are reversely biased, in order to prevent crosstalk occurrence within the photodetecting element groups $3_n$. For this reason, charge is stored in parasitic capacitances 10 between the group wires $8_n$ and ground. When one of the photodetecting element groups is connected to the common wire 5, the charge stored in the parasitic capacitances flows into the read circuit 4, and acts as noise. To cope with the noise generation problem, it has been proposed that a power source 6', a capacitor 10' having a capacitance value approximately equal to that of the parasitic capacitance 10, and a switch 7', are coupled with the common wire 5. In this construction, when the switch 7' is closed, the charge with the opposite polarity is applied to the group wire $8_n$ to be read, to cancel the noise.

However, in the above approach, the analog switch used produces switching noise, which reduces the S/N ratio of the detect signal. For example, in a sensor having a resolution of 16 dots/mm, charge generated per pixel is approximately 0.1 pC, while the switching noise of a commercially available CMOS analog switch is 10 pC. Therefore, the valid signal is covered with the switching noise, making it difficult to detect the valid signal.

SUMMARY OF THE INVENTION

The present invention has been made in view of the above circumstances and has an object to provide an image sensor which can remove the noise component from the valid image signal with a simple construction, and improve the S/N ratio to be operable for multi-tone image sensing.

To achieve the above object, an image sensor according to the invention having a linear array of a plurality of photodetecting element groups each including a plurality of photodetecting elements each consisting of first and second photo diodes connected in series and oppositely in polarity, in which read pulses are applied sequentially to the second photo diodes of the photodetecting elements of each photodetecting element group by a matrix drive system, and image signals are read by a read circuit connected to the first photo diodes of the photodetecting elements, the image sensor comprises first capacitor portions each connected to each of the second photo diodes of the photodetecting elements, a first shift register, of which the respective bits are connected to the first capacitor portions for each photodetecting element group, for sequentially applying drive pulses to the photodetecting element groups, second capacitor portions each connected to each of the second photo diodes of the photodetecting elements, a second shift register, of which the respective bits are connected to the second capacitor portions in a matrix fashion, for sequentially applying read pulses to the photodetecting elements, and leak means coupled with the second photo diodes of the photodetecting elements.

With such an arrangement, the first shift register applies the drive pulses to select one of the photodetecting element groups. The second shift register sequentially applies the read pulses to the photodetecting elements in the selected photodetecting element group, thereby to pick up image signals. Further, the leak means returns the potentials at the second photo diode sides of the photodetecting elements to the original potential.

BRIEF DESCRIPTION OF THE DRAWINGS

The accompanying drawings, which are incorporated in and constitute a part of this specification illustrate illustrate embodiments of the invention and, together with the description, serve to explain the objects, advantages and principles of the invention. In the drawings.

DETAILED DESCRIPTION OF THE PREFERRED EMBODIMENT

Figure 1:
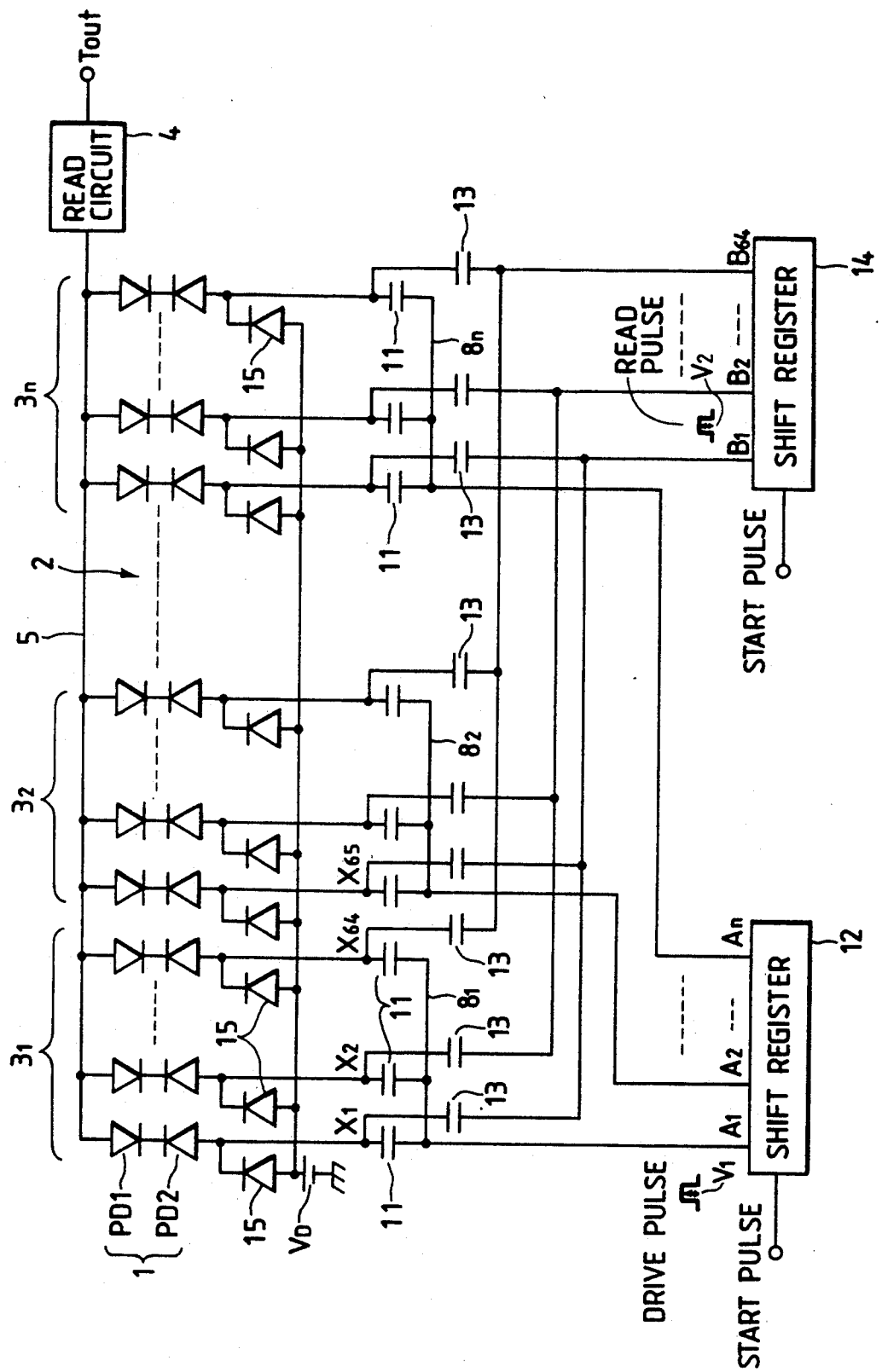
FIG. 1 is a diagram showing an equivalent circuit of an image sensor according to an embodiment of the invention.

A preferred embodiment of an image sensor according to the present invention will be described with reference to FIG. 1.

An image read section of the image sensor includes a photodetecting element array 2 as a linear array of photodetecting elements 1 each consisting of a photo diode PD1 and another photo diode PD2 as a blocking diode, both the photo diodes PD1 and PD2 being connected in series and oppositely in polarity. The photodetecting element array 2 includes a plurality ("n" number) of groups $3_1$-$3_n$ each consisting of a plurality (sixty-four) photodetecting elements 1. The photo diodes PD1 in the photodetecting element groups $3_1$-$3_n$ are connected to a common wire 5, which is connected to a read circuit 4.

The anode of the photo diode PD2 of each photodetecting element 1 is coupled with one end of a first capacitor portion 11. The other ends of the first capacitor portions 11 are connected to group wires $8_1$-$8_n$ every group. Those group wires $8_1$-$8_n$ are respectively coupled with the output terminals $A_1$-$A_n$ of a first shift register 12. With the connection, the first shift register 12 sequentially applies drive pulses to the photodetecting element groups $3_1$-$3_n$.

The anode of the photo diode PD2 of each photodetecting element 1 is further coupled with one end of a second capacitor portion 13. The other ends of the second capacitor portions 13 are respectively coupled with the output terminals $B_1$-$B_{64}$ of a second shift register 14 in a matrix fashion. That is, the 64 number of photodetecting elements 1, which make up the photodetecting element group 3, are respectively connected to the output terminals $B_1$-$B_{64}$ of the second shift register 14. Similarly, the 64 number of photodetecting elements 1, which make up the photodetecting element group $3_n$, are respectively connected to the output terminals $B_1$-$B_{64}$ of the second shift register 14. With the connection, the second shift register 14 sequentially applies read pulses to the 64 photodetecting elements 1 in the subject photodetecting element group.

The capacitance values of the first and second capacitor portions 11 and 12 are set to be relatively larger than those of the photo diodes PD1 and PD2.

The photo diode PD2 of each photodetecting element 1 is coupled with a leak means. In the leak means, a diode 15 is connected at one end to the photo diode PD2. The other ends of the diodes 15, which are thus coupled with the photodetecting elements 1, are connected in common to a power source $V_D$ for supplying a positive voltage. The negative side of the power source $V_D$ is connected to earth. The diode 15 may be replaced by an element with a large time constant. For example, the diode 15 per se may be used in a manner that the diode is connected with its polarity being inverted, and its reverse current is utilized (see FIG. 2(a)). Alternatively, a resistor 16 may be used (see FIG. 2(b)). In this case, the resistance value of the resistor 16 is approximately 10 MΩ. The voltage of the power source $V_D$ contained in the leak means is set to be between $V_1$ and $-V_1$ or $V_2$ and $-V_2$, where $V_1$ indicates a drive pulse voltage applied by the first shift register 12, and $V_2$ indicates a read pulse voltage applied by the second shift register 14.

Figure 2A:
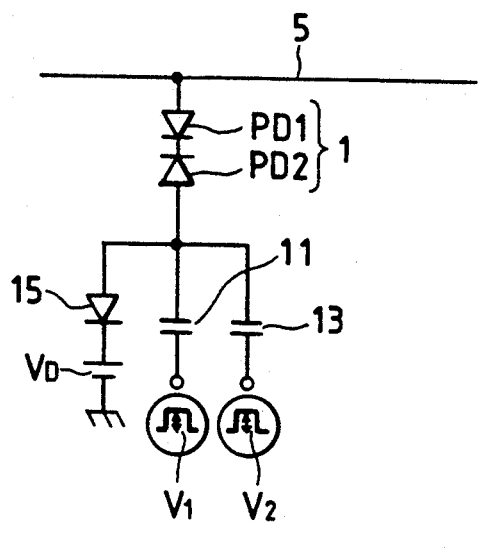
FIGS. 2(a) through 2(c) are circuit diagrams showing some modifications of a part of the image sensor including a photodetecting element and a leak means associated therewith.
Figure 2B:
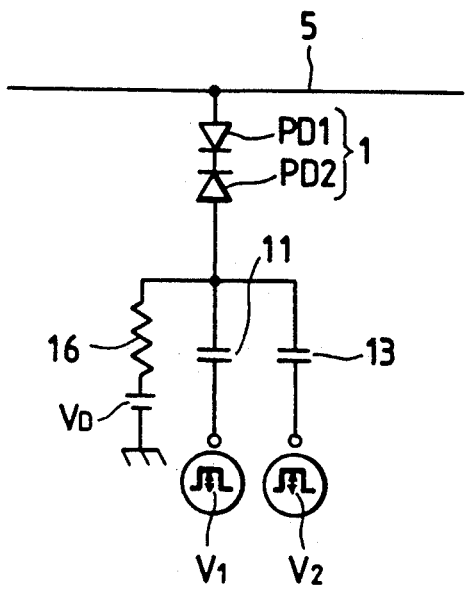
Figure 2C:
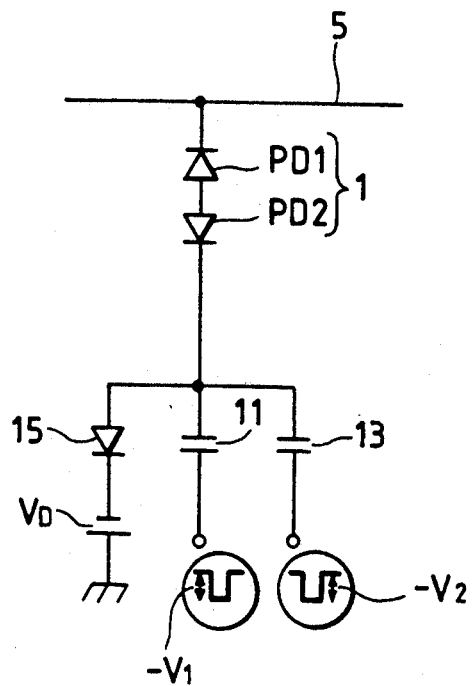

When a diode is used for the leak means, a connection among the diode 15, and the photo diodes PD1 and PD2 as shown in FIG. 2(c) is allowed, in addition to the connections shown in FIG. 1 and FIG. 2(a). In the case of FIG. 2(c), the polarities of the power source $V_D$, the drive pulse voltage $V_1$ applied by the first shift register 12, and the read pulse voltage $V_2$ applied by the second shift register 14, must be inverted.

Figure 3A:
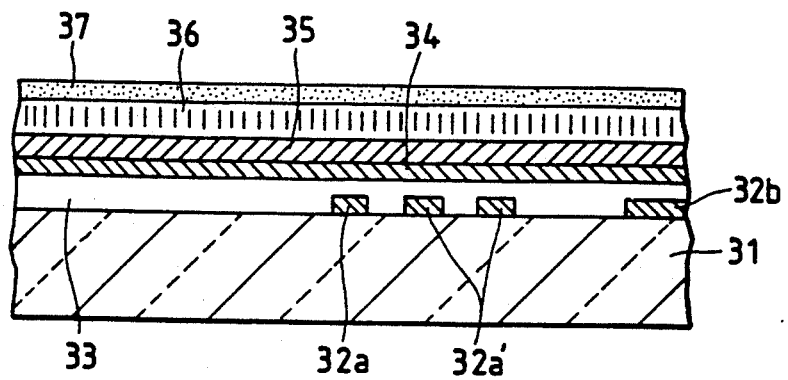
FIGS. 3(a) through 3(c) are sectional views showing several steps of manufacturing the image sensor of FIG. 1.
Figure 3B:
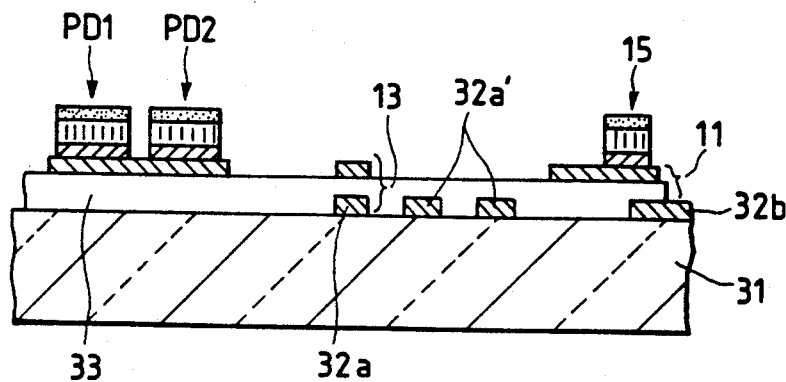
Figure 3C:
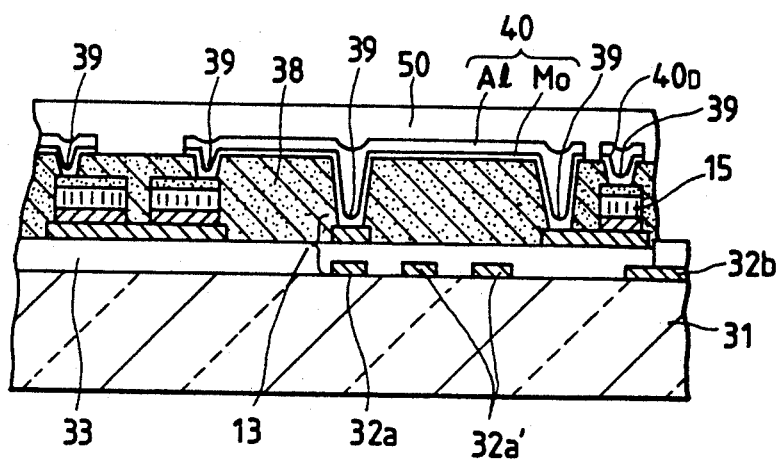

A specific construction of the photodetecting element 1 and its periphery will be described with reference to FIGS. 3(a) through 3(c) showing a manufacturing process of the image sensor.

To start, chromium (Cr) is deposited, by the sputtering method, on a transparent substrate 31 made of glass, and the deposited chromium layer is etched by the photolithographic method, to form chromium patterns 32a and 32b, which are to serve respectively as the electrodes of the second capacitor portion 13 and the first capacitor portion 11. Then, an SiNx (silicon nitride) layer 33 deposited by the CVD method, a chromium layer 34 by the sputtering method, an n+ a-Si; H (hydrogenated amorphous silicon) layer 35 and an i a-Si; H layer 36 by the CVD method, and an ITO (indium tin oxide) layer 37 by the sputtering method are formed in successive order (FIG. 3(a)). In addition, a chromium pattern 32a' is to serve as the electrodes of other photodetecting elements than the subject photodetecting element.

Subsequently, the ITO layer 37, the i a-Si; H layer 36, the n+ a-Si; H layer 35, the chromium layer 34, and the SiNx layer 33 are subjected to the photolithographic etching process, thereby to form the photo diodes PD1 and PD2, first and second capacitor portions 11 and 13, and the diode 15 (FIG. 3(b)).

The entire surface of the structure is coated with polyimide 38. Contact holes 39 are formed at the points corresponding positionally to the photo diodes PD1 and PD2, and the second capacitor portion 13, and at the points at both ends of the diode 15, by the photolithographic etching process. Then, molybdenum (Mo) and aluminum (Al) are successively deposited over the structure by the sputtering method. Thereafter, the structure is subjected to the photolithographic etching process to form a wiring pattern 40. Further, the top surface of the structure is coated with a passivation film as a protecting film 50 (FIG. 3(c)).

In the structure thus formed, the chromium pattern 32a of the second capacitor portion 13 is connected to the output terminal (any of $B_1$ to $B_{64}$) of the second shift register 14. The chromium pattern 32b of the first capacitor portion 11 is connected to the output terminal (any of $A_1$ to $A_n$) of the shift register 12. A wiring pattern $40_D$ connected to the diode 15 is connected to the power source $V_D$.

In the structure as mentioned above, as the SiNx layer, which is not related to the photo diodes PD1 and PD2, is used for the insulating layer for the first and second capacitor portions 11 and 13, the thickness of the SiNx layer may be selected as desired. For example, if the SiNx layer 33 is set to be thick, desired capacitance can be obtained with a small area, leading to reduction of the device area.

Figure 4A:
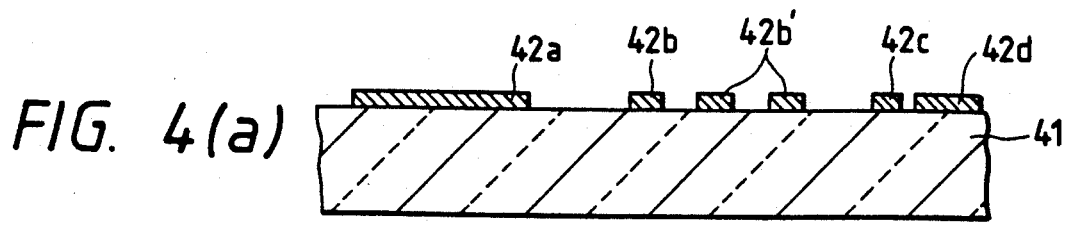
FIGS. 4(a) through 4(e) are sectional views showing several steps of manufacturing the image sensor in another manner.
Figure 4B:
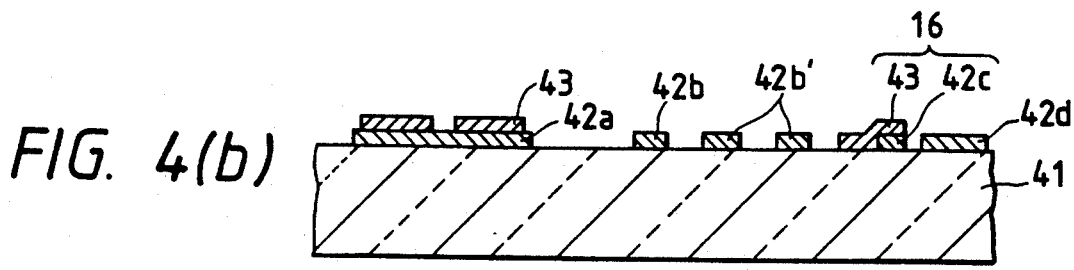
Figure 4C:
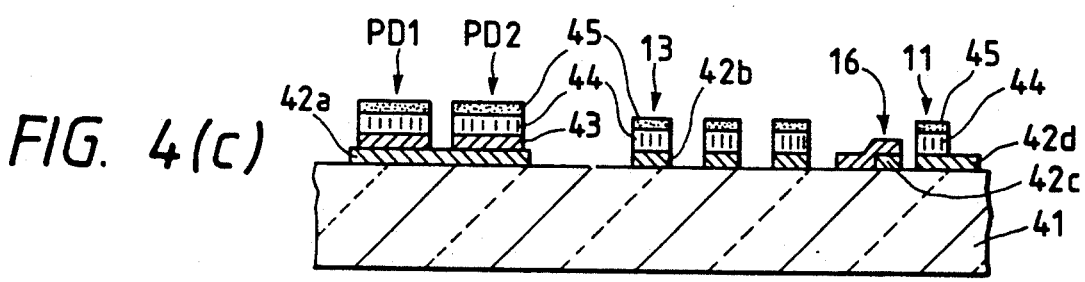

Another specific construction of the photodetecting element 1 and its periphery will be described with reference to FIGS. 4(a) through 4(c) showing a manufacturing process of the image sensor.

To start, chromium (Cr) is deposited, by the sputtering method, on a transparent substrate 41 made of glass, and the deposited chromium layer is etched by the photolithographic method, to form metal electrode 42a of the photo diodes PD1 and PD2, a chromium pattern 42b to serve as the electrode of the second capacitor portion 13, a chromium pattern 42c to serve as the electrodes of the resistor portion constituting the leak means, and a chromium pattern 42d to serve as the electrode of first capacitor portion 11 (FIG. 4(a)). Further, a chromium pattern 42b' is to serve as the electrodes corresponding to the second capacitor portions of other photodetecting elements than the subject photodetecting element 1.

Then, an n+ a-Si is deposited by the CVD method is subjected to the photolithographic etching process to form an n+ a-Si layer 43 on the metal electrode 42a. At the same time, an n+ a-Si layer 43 to be used as resistor material is formed on the chromium pattern 42c, thereby to form resistors R (FIG. 4(b)).

Then, i a-Si is deposited by the CVD method, and ITO is deposited by the sputtering method. The ITO and i a-Si are etched to form an i a-Si layer 44 and an ITO layer 45 on the n+ a-Si layer 43, chromium patterns 42b and 42b', and chromium pattern 42d. As a result, the photo diodes PD1 and PD2, and first and second capacitor portions 11 and 13 are formed (FIG. 4(c)).

Figure 4D:
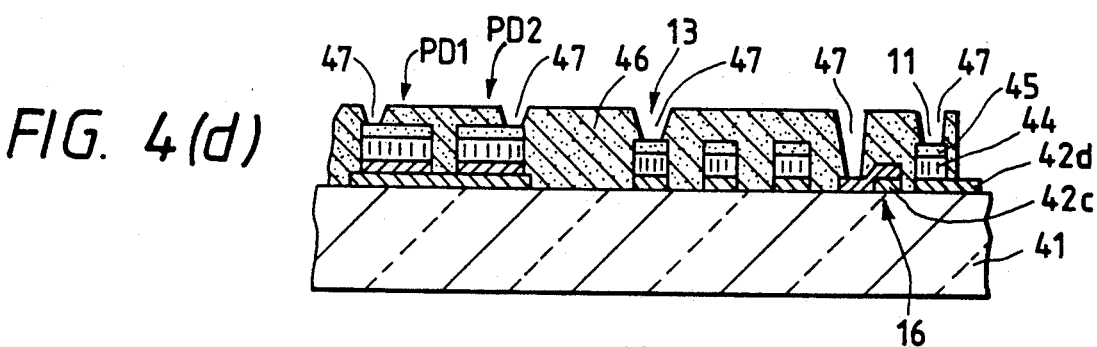

The entire surface of the structure is coated with polyimide 46. Contact holes 47 are formed at the points corresponding positionally to the photo diodes PD1 and PD2, the first and second capacitor portions 11 and 13, and the resistors R, by the photolithographic etching process (FIG. 4(d)).

Figure 4E:
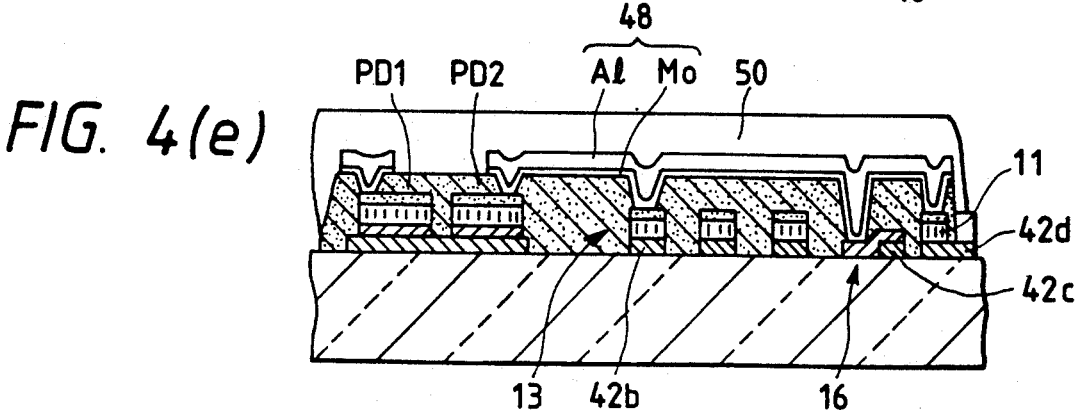

Then, molybdenum (Mo) and aluminum (Al) are successively deposited over the structure by the sputtering method. Thereafter, the structure is subjected to the photolithographic etching process to form a desired wiring pattern 48. The top surface of the structure is coated with a passivation film as a protecting film 50 (FIG. 4(e)).

In the structure thus formed, the chromium pattern 42b of the second capacitor portion 13 is connected to the output terminal (any of $B_1$ to $B_{64}$) of the second shift register 14. The chromium pattern 42d of the first capacitor portion 11 is connected to the output terminal (any of $A_1$ to $A_n$) of the first shift register 12. A wiring pattern 42c layered under the resistor R is connected to the power source $V_D$.

In the structure as mentioned above, the photo diode having the sandwich structure of ITO/a-Si/Cr, that is, shielded from light, is used as the first and second capacitor portions 11 and 13.

A method of driving the image sensor of FIG. 1 will be described with reference to a timing chart shown in FIG. 5.

In response to a start pulse, the first shift register 12 outputs drive pulses from the output terminals $A_1$ to $A_n$. The drive pulse outputted from the first bit $A_1$ of the shift register 12 is applied to the photodetecting elements 1 of the photodetecting element group $3_1$, through the first capacitor portions 11. At "+5 V" of the drive pulse, the potential $V_{X1}$ is $V_1$ at point $X_1$ (FIG. 1) close to the photo diode PD2.

When the drive pulse is at "+5 V", if a start pulse is applied to the second shift register 14, the shift register outputs read pulses from the output terminals $B_1$ to $B_{64}$. The read pulses are applied from the shift register 14 to the photodetecting elements 1 through the second capacitor portions 13. At this time, when the read pulse is at "+5 V", the potential $V_{X1}$ at the point $X_1$ is $(V_1+V_2)$. The photo diode PD2 is forwardly biased, while the photo diode PD1 is reversely biased at approximately $(V_1+V_2)$.

When the read pulse is turned to "0V" (the drive pulse is at "+5 V"), the potential $V_{X1}$ is turned to $V_1$ and the photo diode PD2 becomes to be reversely biased to terminate the reset of the photodetecting element 1 for the first picture element. The sequence of such operations is performed for all the photodetecting elements 1 in the photodetecting element group $3_1$, those of all the remaining photodetecting element groups. Thus, the reset scan is performed for all the photodetecting elements 1.

The trailing edge of the current pulse is coincident with the rising edge of the next pulse in timing, for the drive pulses from the respective output terminals of the shift register 12 and the read pulses from the respective output terminals of the shift register 14.

Following the reset scan, light reflected from an original document (not shown) placed on the image sensor is incident into the photodetecting elements 1, causing the photo diodes PD1 to discharge.

Next, a read operation of image signals is performed as the reset scan operation. That is, when the drive pulse of the first shift register 12 and the read pulse of the second shift register 14 are at "+5 V", the potential $V_{X1}$ at the point $X_1$ is $(V_1+V_2)$, the photo diode PD2 is forwardly biased and the photo diode PD1 is recharged to $(V_1+V_2)$ At this time, the charge current flows into the common wire 5, so that the image signals of the photodetecting elements 1 are picked up by the read circuit 4.

When the read pulse is turned to "0V" (the drive pulse is at "+5 V"), the potential $V_{X1}$ at the point $X_1$ is turned to $V_1$, and the photo diode PD2 becomes to be reversely biased to prevent the crosstalk among the photodetecting elements.

The above sequence of operations is performed for all the photodetecting elements 1, and the image signals of the photodetecting elements 1 are time-sequentially produced at the output terminal of the read circuit 4.

Figure 5:
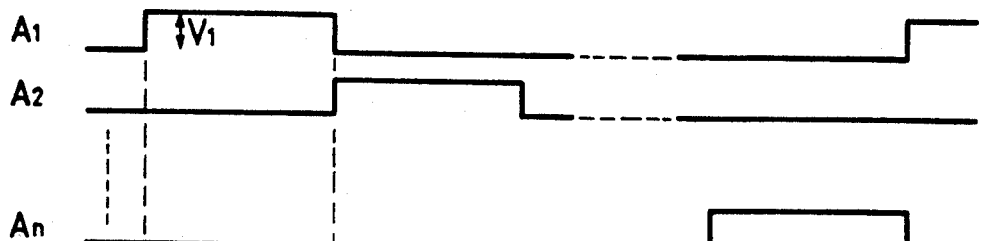
FIG. 5 is a timing chart useful in explaining a method of driving the image sensor of FIG. 1.
Figure 5:
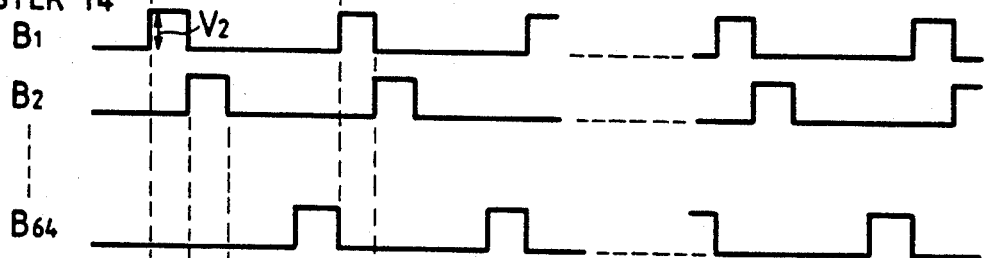
Figure 5:
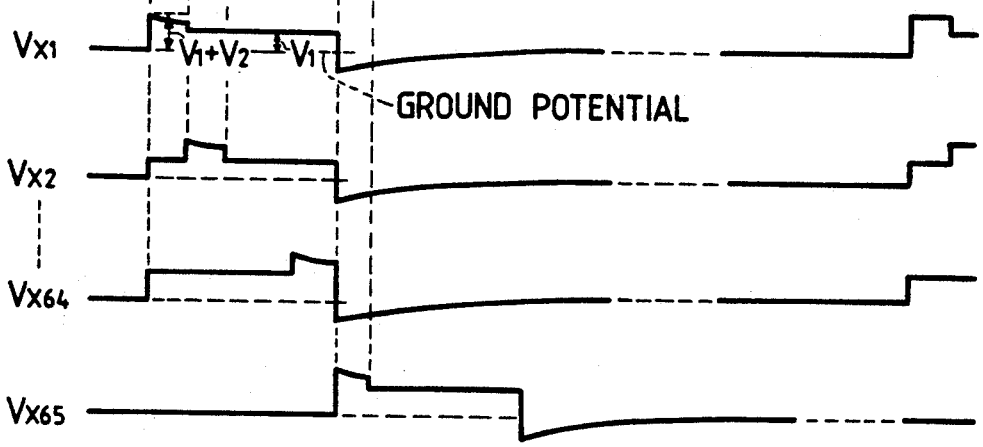

Since the first and second capacitor portions 11 and 13 are charged by the charge current, the potential $V_{X1}$ at the point $X_1$ goes to a negative voltage below the ground level, not returning to the original potential, as shown in FIG. 5, if the drive pulse and the read pulse are turned to "0V". It is for this reason that the diode 15 is reversely connected to the point $X_1$, and the positive power source $V_D$ is applied to the diode 15. With the connection, the charge leaks to restore the potential thereat to the original potential.

When the reflecting light is not incident on the photodetecting elements 1, the charge is not discharged from the photo diode PD1. Accordingly, if the drive pulse and the read pulse are turned to "+5 V" and the potential $V_{X1}$ is turned to $(V_1+V_2)$, the photo diode PD2 is not forwardly biased, so that no current flows through the common wire 5. Consequently, no signal is produced at the output terminal of the read circuit 4.

As seen from the foregoing description, in the image sensor of the embodiment, unlike the image sensor based on the conventional matrix drive system, there is no need for applying a bias voltage to the photodetecting elements in the other photodetecting element groups than the photodetecting element group being subjected to the read operation. Accordingly, the image sensor can prevent the switching noise caused by the analog switches.

Figure 6:
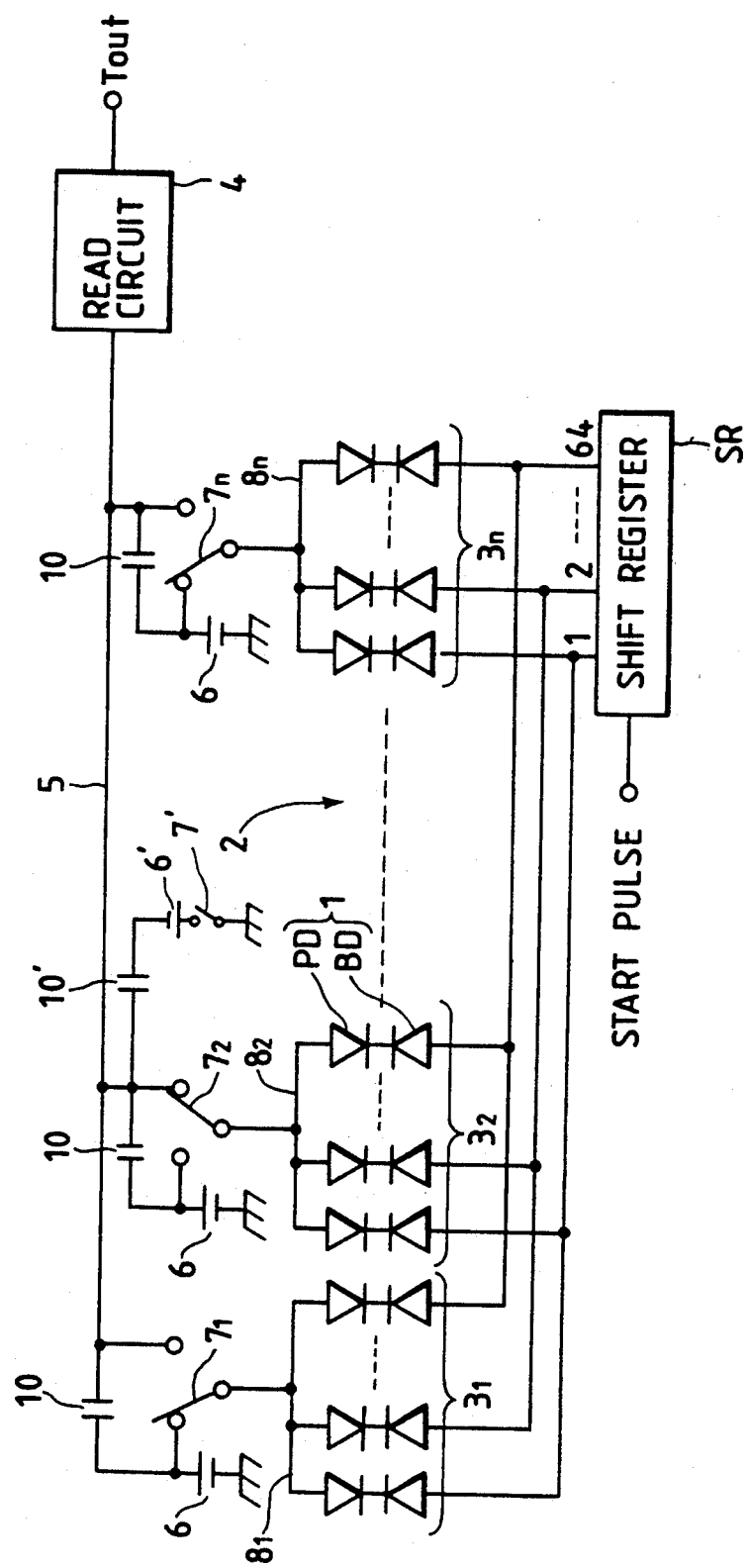
FIG. 6 is a diagram showing an equivalent circuit of a conventional image sensor.

Further, the capacitor 10', power source 6', and switch 7' provided in the conventional image sensor (FIG. 6), are not used in the image sensor of the embodiment. In this respect, the image sensor is simplified in construction.

Additionally, since the trailing edge of the current pulse is coincident with the rising edge of the next pulse in timing for the drive pulses and the read pulses, the switching noises generated at the rising edges and the trailing edges can be canceled out each other.

As described above, in the present invention, since any switching elements for the matrix drive are not used, the construction of the image sensor is simplified, and the noise is removed. Therefore, the image sensor of the invention can produce image signals with high S/N ratio, and is well adaptable for multi-tone image sensing.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An image sensor having a linear array of a plurality of photodetecting element groups each including a plurality of photodetecting elements each consisting of first and second photo diodes connected in series and oppositely in polarity, in which read pulses are applied sequentially to the second photo diodes of the photodetecting elements of each photodetecting element group by a matrix drive system, and image signals are read by a read circuit connected to the first photo diodes of the photodetecting elements, said image sensor comprising:
   first capacitor portions each connected to each of the second photo diodes of the photodetecting elements;
   a first shift register, of which the respective bits are connected to said first capacitor portions for each photodetecting element group, for sequentially applying drive pulses to the photodetecting element groups;
   second capacitor portions each connected to each of the second photo diodes of the photodetecting elements;
   a second shift register, of which the respective bits are connected to said second capacitor portions in a matrix fashion, for sequentially applying read pulses to the photodetecting elements; and
   leak means coupled with the second photo diodes of the photodetecting elements.

2. The image sensor according to claim 1, wherein the first and second photo diodes are connected to each other at cathodes thereof in each of the photodetecting elements.

3. The image sensor according to claim 2, wherein said leak means includes a diode and a D.C. power source for each of the photodetecting elements.

4. The image sensor according to claim 3, wherein a cathode of said diode is connected to an anode of the second photo diode, and an anode of said diode is connected to a positive electrode of the D.C. power source.

5. The image sensor according to claim 3, wherein an anode of said diode is connected to an anode of the second photo diode, and a cathode of said diode is connected to a positive electrode of the D.C. power source.

6. The image sensor according to claim 2, wherein said leak means includes a resistor and a D.C. power source for each of the photodetecting elements, and a positive electrode of said D.C. power source is connected to an anode of the second photo diode through said resistor.

7. The image sensor according to claim 1, wherein the first and second photo diodes are connected to each other at anodes thereof in each of the photodetecting elements.

8. The image sensor according to claim 7, wherein said leak means includes a diode and a D.C. power source for each of the photodetecting elements.

9. The image sensor according to claim 8, wherein an anode of said diode is connected to a cathode of the second photo diode, and a cathode of said diode is connected to a negative electrode of the D.C. power source.

* * * * *